(12) United States Patent
Moreau

(10) Patent No.: US 10,462,922 B2
(45) Date of Patent: Oct. 29, 2019

(54) LOCKING DEVICE FOR RACKABLE ELECTRONIC EQUIPMENT

(71) Applicant: Connecteurs Electriques Deutsch, Evreux (FR)

(72) Inventor: Jean-Luc Moreau, Chateaudun (FR)

(73) Assignee: Connecteurs Electriques Deutsch, Evreux (FR)

( * ) Notice: Subject to any disclaimer, the term of this patent is extended or adjusted under 35 U.S.C. 154(b) by 12 days.

(21) Appl. No.: 15/417,352

(22) Filed: Jan. 27, 2017

(65) Prior Publication Data

US 2017/0135241 A1 May 11, 2017

Related U.S. Application Data

(63) Continuation of application No. PCT/EP2015/067563, filed on Jul. 30, 2015.

(30) Foreign Application Priority Data

Jul. 31, 2014 (FR) .................................. 14 57414

(51) Int. Cl.
*H05K 7/14* (2006.01)

(52) U.S. Cl.
CPC ......... *H05K 7/1409* (2013.01); *H05K 7/1412* (2013.01); *H05K 7/1439* (2013.01)

(58) Field of Classification Search
CPC .. H05K 7/1409; H05K 7/1439; H05K 7/1412; G06F 1/1656; G06F 1/181–1/187
See application file for complete search history.

(56) References Cited

U.S. PATENT DOCUMENTS

| | | | | |
|---|---|---|---|---|
| 5,268,821 A | * | 12/1993 | Wong .................. | H01R 13/629 211/41.17 |
| 6,418,762 B1 | * | 7/2002 | Munch ................. | E05B 13/002 312/216 |
| 6,695,520 B1 | | 2/2004 | Sarno et al. | |
| 7,684,210 B2 | | 3/2010 | Kosugi et al. | |
| 8,203,851 B2 | | 6/2012 | Boetzer | |
| 8,749,966 B1 | | 6/2014 | Boudreau et al. | |
| 2004/0008497 A1 | * | 1/2004 | Barringer ............ | H05K 7/1409 361/759 |

(Continued)

FOREIGN PATENT DOCUMENTS

| | | |
|---|---|---|
| CN | 1305690 A | 7/2001 |
| CN | 101043802 A | 9/2007 |

(Continued)

OTHER PUBLICATIONS

PCT Notification, International Preliminary Report on Patentability, dated Feb. 9, 2017, 7 pages.

(Continued)

*Primary Examiner* — Steven T Sawyer
*Assistant Examiner* — Sagar Shrestha
(74) *Attorney, Agent, or Firm* — Barley Snyder

(57) ABSTRACT

A locking device for a rackable piece of electronic equipment is disclosed. The locking device has a first beam and a second beam hinged to the first beam. The first beam and the second beam removably engage at least one lock of the rackable piece of electronic equipment and are capable of locking the rackable piece of electronic equipment to a backplane of a rack.

27 Claims, 6 Drawing Sheets

(56) References Cited

U.S. PATENT DOCUMENTS

| | | | |
|---|---|---|---|
| 2004/0047128 A1 | 3/2004 | McClelland, II et al. | |
| 2004/0192095 A1 | 9/2004 | Joist | |
| 2012/0106046 A1* | 5/2012 | Ho | G11B 33/128 |
| | | | 361/679.01 |
| 2012/0218705 A1* | 8/2012 | Huang | G06F 1/187 |
| | | | 361/679.37 |
| 2014/0233182 A1* | 8/2014 | Demange | H05K 7/1409 |
| | | | 361/679.58 |
| 2015/0296649 A1* | 10/2015 | Wang | H05K 7/1409 |
| | | | 403/326 |

FOREIGN PATENT DOCUMENTS

| | | |
|---|---|---|
| CN | 101801164 A | 8/2010 |
| EP | 2257145 A1 | 12/2010 |

OTHER PUBLICATIONS

"Single-Lever Printed Circuit Card Inserter/Extractor", IBM Technical Disclosure Bulletin, International Business Machines Corp. (Thornwood), US, vol. 32, No. 4B, Sep. 1989 (Sep. 1989), pp. 204-209, XP000067013, ISSN: 0018-8689.
PCT International Search Report and Written Opinion, dated Oct. 6, 2015, 8 pages.
Chinese First Office Action and English translation, dated Sep. 28, 2018, Application No. 201580041337.X, 19 pages.

* cited by examiner

LOCKING DEVICE FOR RACKABLE ELECTRONIC EQUIPMENT

CROSS-REFERENCE TO RELATED APPLICATION

This application is a continuation of PCT International Application No. PCT/EP2015/067563, filed on Jul. 30, 2015, which claims priority under 35 U.S.C. § 119 to French Patent Application No. 1457414, filed on Jul. 31, 2014.

FIELD OF THE INVENTION

The present invention relates to a locking device, and more particularly, to a locking device for a rackable piece of electronic equipment.

BACKGROUND

Pieces of equipment, and in particular removable electronic boards, able to be connected to a backplane connector of a rack are known in the prior art. In the aviation field, given the strong vibrations experienced by the onboard electronic apparatus, it is known to provide locking of the electronic board to the backplane by a central screw system. Such a system proves effective for the maintenance of locking during vibration but is expensive and slow to operate. Another integrated locking system is also known using inserters, however, the inserter system has limited locking power when the number of contacts to be connected becomes large.

Known electronic racks, to save various costs, integrate an increasing number of electronic boards including an increasing number of contacts to be connected, the insertion and extraction forces of the boards thereby increasing correspondingly. Increasingly powerful and strong locking systems are therefore necessary, such as the integrated connection system known from patent EP 2257145 B 1. EP 2257145 B1 discloses a hinged lever integrated at the back of a rackable electronic board and cooperating with locking strips of the board which allow hooking onto the backplane of the rack and, under the action of the lever, traction of the board so as to cause it to advance in the rack and to lock the assembly. However, such locking systems, although providing powerful and strong locking, are also heavy and costly.

SUMMARY

An object of the invention, among others, is to provide a quick, light and more economical locking device without sacrificing locking effectiveness. The locking device has a first beam and a second beam hinged to the first beam. The first beam and the second beam removably engage at least one lock of the rackable piece of electronic equipment and are capable of locking the rackable piece of electronic equipment to a backplane of a rack.

BRIEF DESCRIPTION OF THE DRAWINGS

The invention will now be described by way of example with reference to the accompanying figures, of which.

DETAILED DESCRIPTION OF THE EMBODIMENT(S)

The invention is explained in greater detail below with reference to embodiments of a locking device. This invention may, however, be embodied in many different forms and should not be construed as limited to the embodiments set forth herein; rather, these embodiments are provided so that this disclosure will be thorough and complete and still fully convey the scope of the invention to those skilled in the art.

Figure 1:
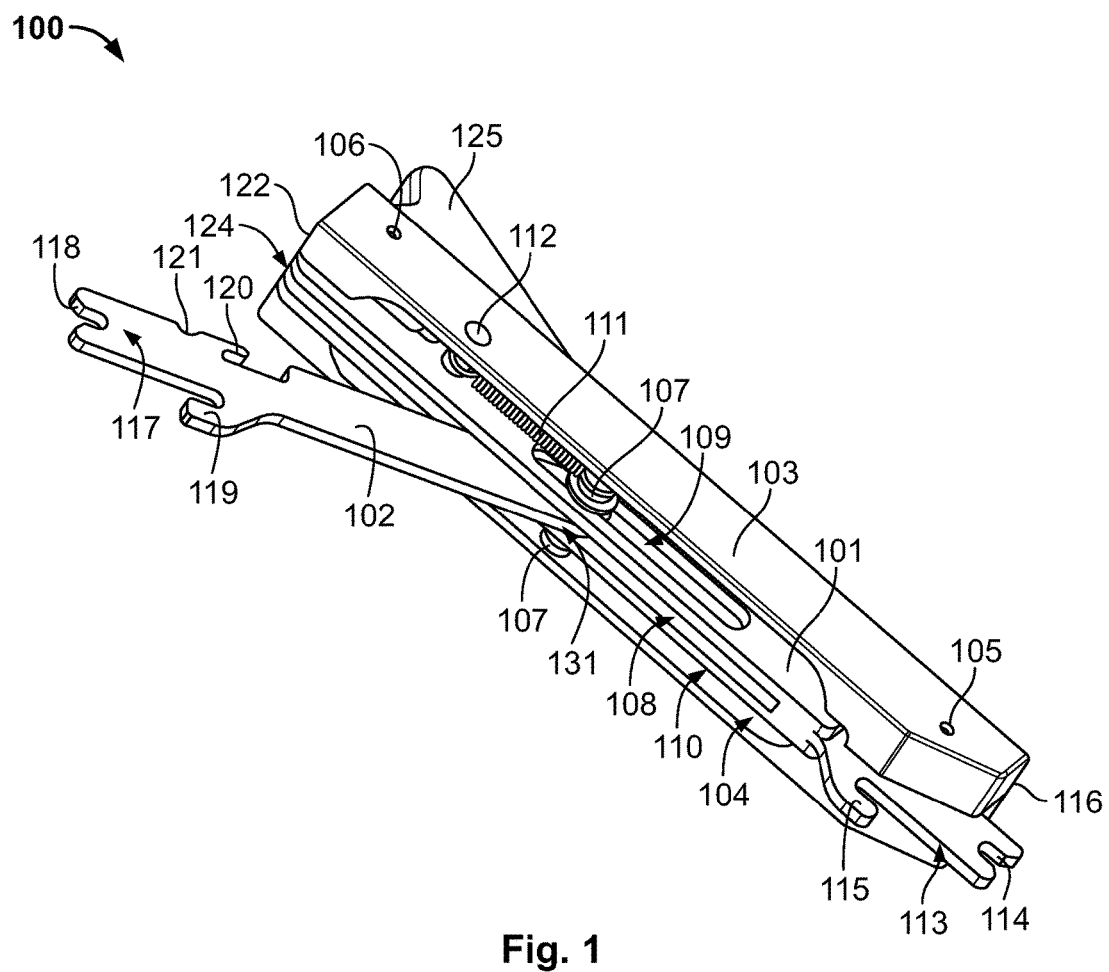
FIG. 1 is a perspective view of a locking device according to an embodiment of the invention.

A locking device 100 according to the invention is shown generally in FIG. 1. The locking device 100 includes a first beam 101 and a second beam 102 hinged to the first beam 101 and pivotable with respect to the first beam 101.

The locking device 100, as shown in FIG. 1, also has a handle 103. The handle 103 has a first end 116 and an opposite second end 122. The handle 103 has a beam receiving recess 104 in which the first beam 101 is disposed and fixed; the handle 103 has a pair of rods 105, 106 extending through the first beam 101 in a direction transverse to a longitudinal direction of the handle 103.

In the embodiment shown in FIG. 1, each of the beams 101, 102 is an elongated strip. The first beam 101 and the handle 103 extend longitudinally in the same direction, defining a first longitudinal direction of the locking device 100. A direction in which the second beam 102 extends can then define a second longitudinal direction of the locking device 100, forming a variable angle with the first longitudinal direction depending on the relative position of the two beams 101, 102.

The second beam 102, as shown in FIG. 1, has a first end 131 and an opposite second end 117. The first end 131 of the second beam 102 is attached to the first beam 101. A spindle 107 extends through the first beam 101 and the first end 131 of the second beam 102 to pivotably attach the second beam 102 to the first beam 101. The first end 131 of the second beam 102 is also movable in translation relative to the first beam 101 in a sliding groove 108 extending in the longitudinal direction of the first beam 101. The spindle 107 extends through the sliding groove 108 and slides in a pair of spindle grooves 109, 110 also formed in the first beam 101 during translational motion of the second beam 102. Translational movement of the second beam 102 can be returned by a spring 111 shown in FIG. 1. The spring 111 has a first end fixed to a peg 112 extending between the first beam 101 and the handle 103 and an opposite second end fixed to the spindle 107.

The first beam 101, as shown in FIG. 1, has a first end 113 and an opposite second end 124. The first end 113 of the first beam 101 has a U-shaped first mounting member 114. The first mounting member 114 projects in the first longitudinal direction beyond the first end 116 of the handle 103. The first beam 101 also has a first hook 115 disposed adjacent the first end 113. The first hook 115 projects in the transverse direction and extends in the first longitudinal direction.

Figure 4:
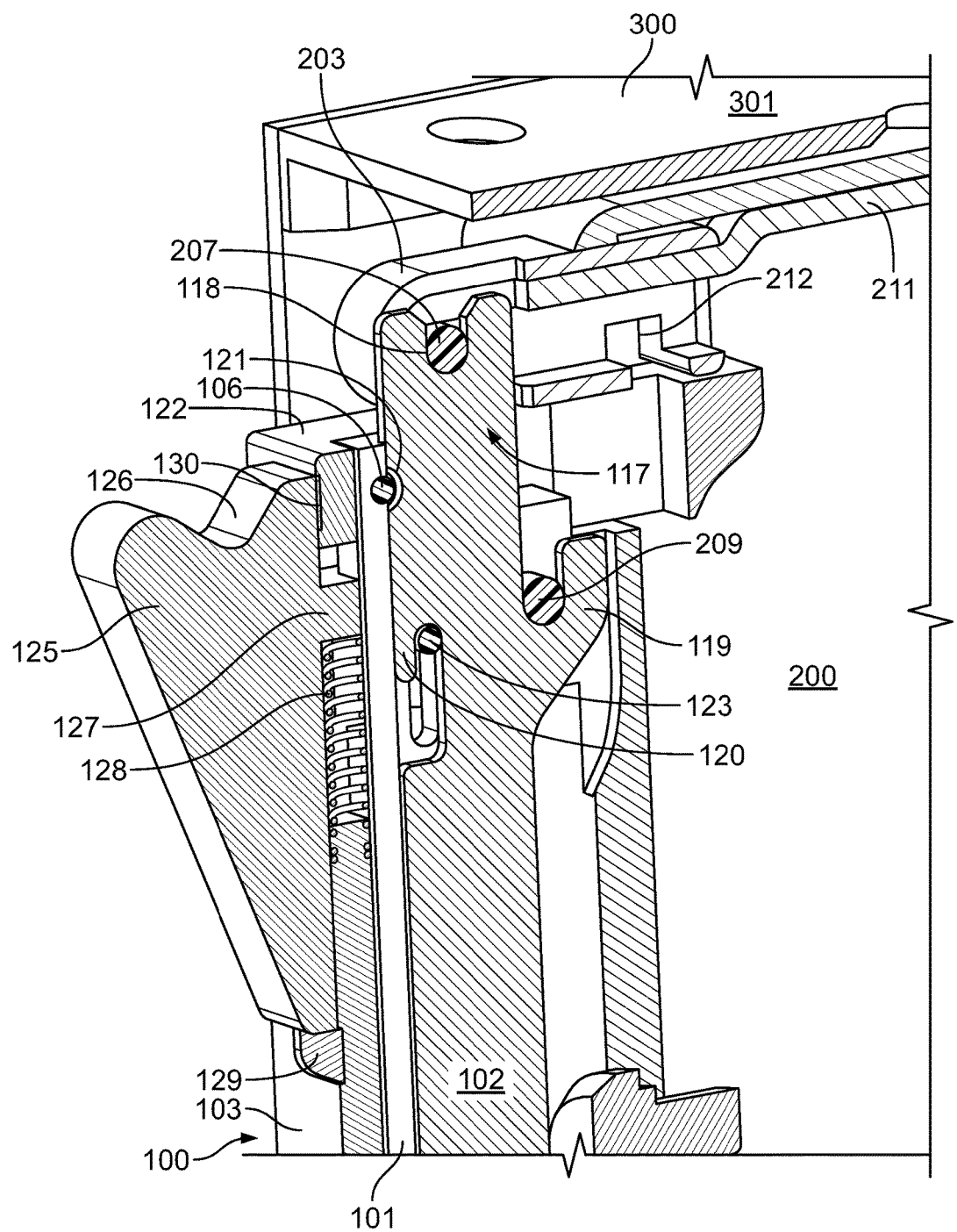
FIG. 4 is a sectional view of the locking device locked to the rackable piece of electronic equipment.

The second end 117 of the second beam 102 is a free end of the second beam 102. A U-shaped second mounting member 118 is disposed at the second end 117. The second beam 102 also has a second hook 119 projecting in a transverse direction relative to the second beam 102 and extending in the second longitudinal direction, the second hook 119 disposed adjacent the second end 117. The second beam 102 also has a third hook 120. The third hook 120 forms a cavity in the second beam 102 and extends in an opposite direction to the second hook 119. The third hook 120 is spaced apart from the second end 117. As shown in FIG. 4, the third hook 120 can catch a locking post 123 inside the locking device 100 so as to maintain the locking in a locked position.

As shown in FIG. 1, the second end 122 of the handle 103 and the second end 124 of the first beam 101 are open to allow retraction of the second beam 102 when the second beam 102 is pivoted toward the locked position. The second beam 102 has a notch 121 adjacent the third hook 120 in the direction of the second end of the beam 117. The notch 121 allows the second beam 102 to be received in the sliding groove 108 without interfering with the rod 106.

The locking device 100, as shown in FIG. 1, also has a locking finger 125 slidably mounted on the handle 103.

Figure 2:
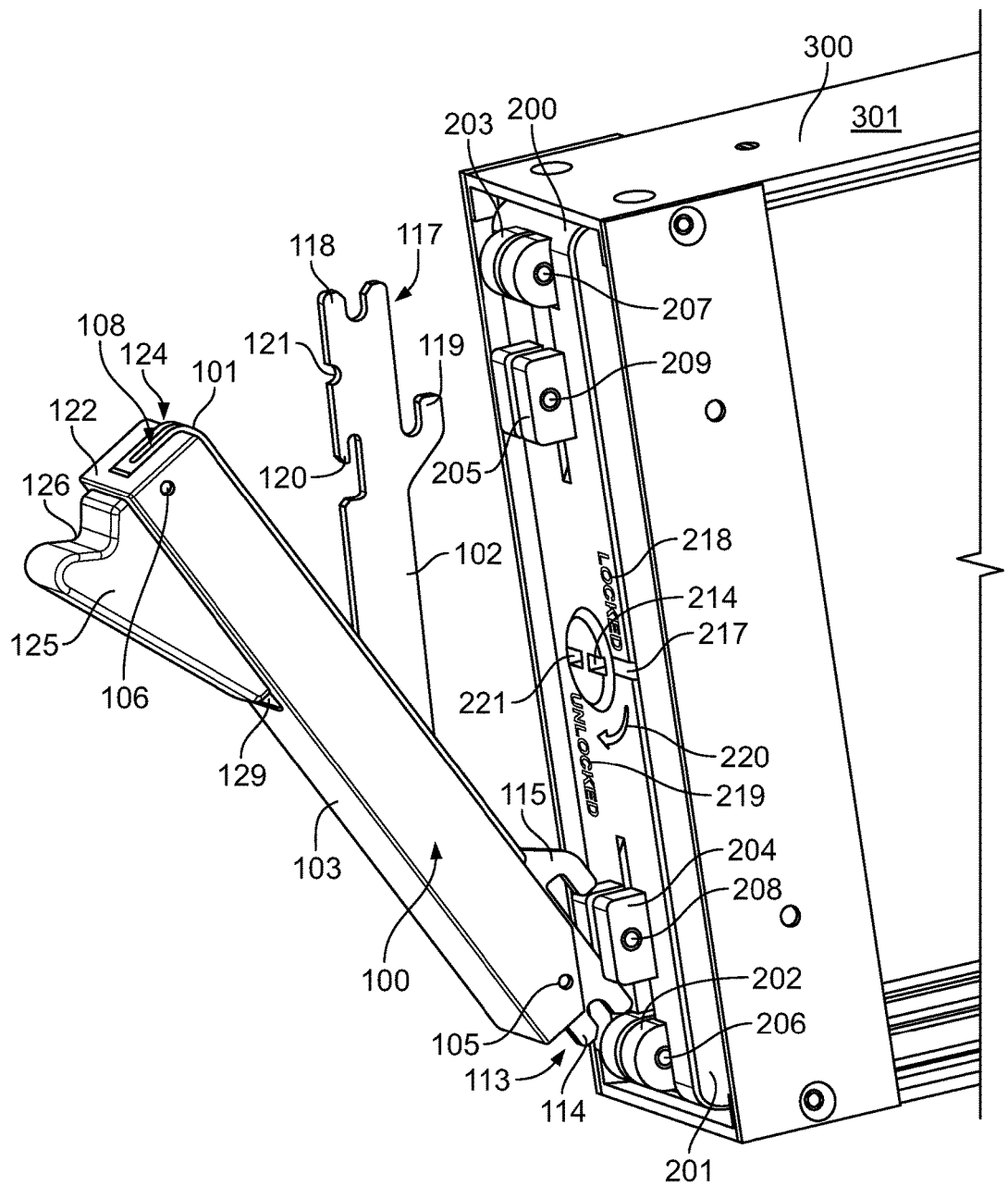
FIG. 2 is a perspective view of the locking device of FIG. 1 and a rackable piece of electronic equipment inserted in a rack.

Along with the locking device 100, a rackable electronic board 200 and a rack 300 are shown in FIG. 2. The electronic board 200 is shown inserted in the rack 300. In the step shown in FIG. 2, the electronic board 200 is inserted in a case 301 of the rack 300 but is not yet locked with a backplane 302 of the rack 300. The insertion can be effected manually by sliding the board 200 into the rack 300. The part not shown of the board 200, or a front part of the board 200, can include a plurality of electrical contacts intended to be plugged into the backplane 302, which can therefore include counterpart electrical contacts. The part of the electronic board 200 visible in FIG. 2 can therefore also be called a back part of the board 200.

Like certain known electronic boards, the board 200 has integrated locks permitting locking to the backplane 302 of the rack 300. However, contrarily to the known integrated locks, the board 200 does not include an integrated locking lever, locking being performed instead by mounting and actuation of the removable locking device 100. Once the board 200 is locked in the rack 300, the locking device 100 can be unmounted from the back of the board 200 and reused to lock or unlock other boards 200.

The board 200, as shown in FIG. 2, has a first movable lock 202, a second movable lock 203, a first fixed lock 204, and a second fixed lock 205. The electronic board 200 thus includes pairs of locks, one mobile and the other fixed relative to a case 201 of the board 200; the first movable 202 and fixed 204 locks, and the second movable 203 and fixed 205 locks.

FIG. 2 shows the beginning of mounting the locking device 100 at the back of the board 200. In the embodiment shown in FIGS. 2 and 3, the first mounting member 114 and the first hook 115 engage the pair of locks 202, 204 and the second mounting member 118 and second hook 119 engage the pair of locks 203, 205. The arrangement of the pairs of locks 202, 204 and 203, 205 is symmetrical, so that the mounting of the locking device 100 can be performed either according to the example shown, or in a symmetrical manner.

Figure 3:
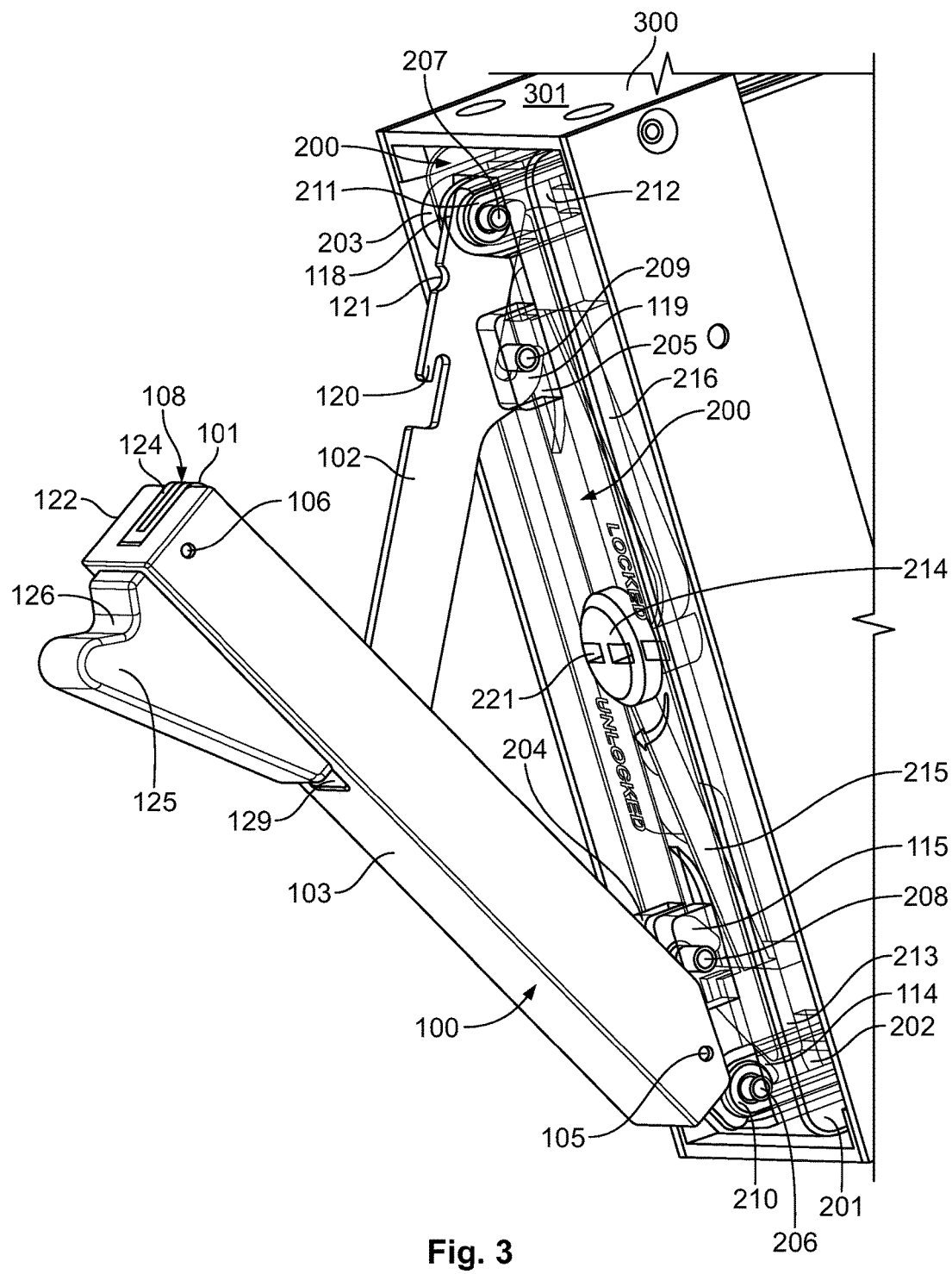
FIG. 3 is a perspective view of the locking device mounted to the rackable piece of electronic equipment inserted in the rack of FIG. 2.

FIG. 3 shows the locking device 100 in position on the back of the board 200, the case 201 of which has been made transparent in order to show the locks 202-205 of the board 200. The first mounting member 114 engages a first movable lock rod 206 of the first movable lock 202, the first movable lock 202 also having a first locking strip 210. An end of the first locking strip 210 is wound around the first movable lock rod 206, and an opposite end is used for locking on the backplane 302 of the rack 300. A first fixed lock rod 208 of the first fixed lock 204 can then be hooked by the first hook 115 of the first beam 101. Similarly, the second beam 102 forms an angle with the first beam 101, which permits, under the action of the spring 111, positioning of the second mounting member 118 to engage a second movable lock rod 207 of the second movable lock 203, also hooking a second fixed lock rod 209 of the second fixed lock 205 by the second hook 119. The second movable lock 203 has a second locking strip 211 with an end wound around the second movable lock rod 207.

Figure 5:
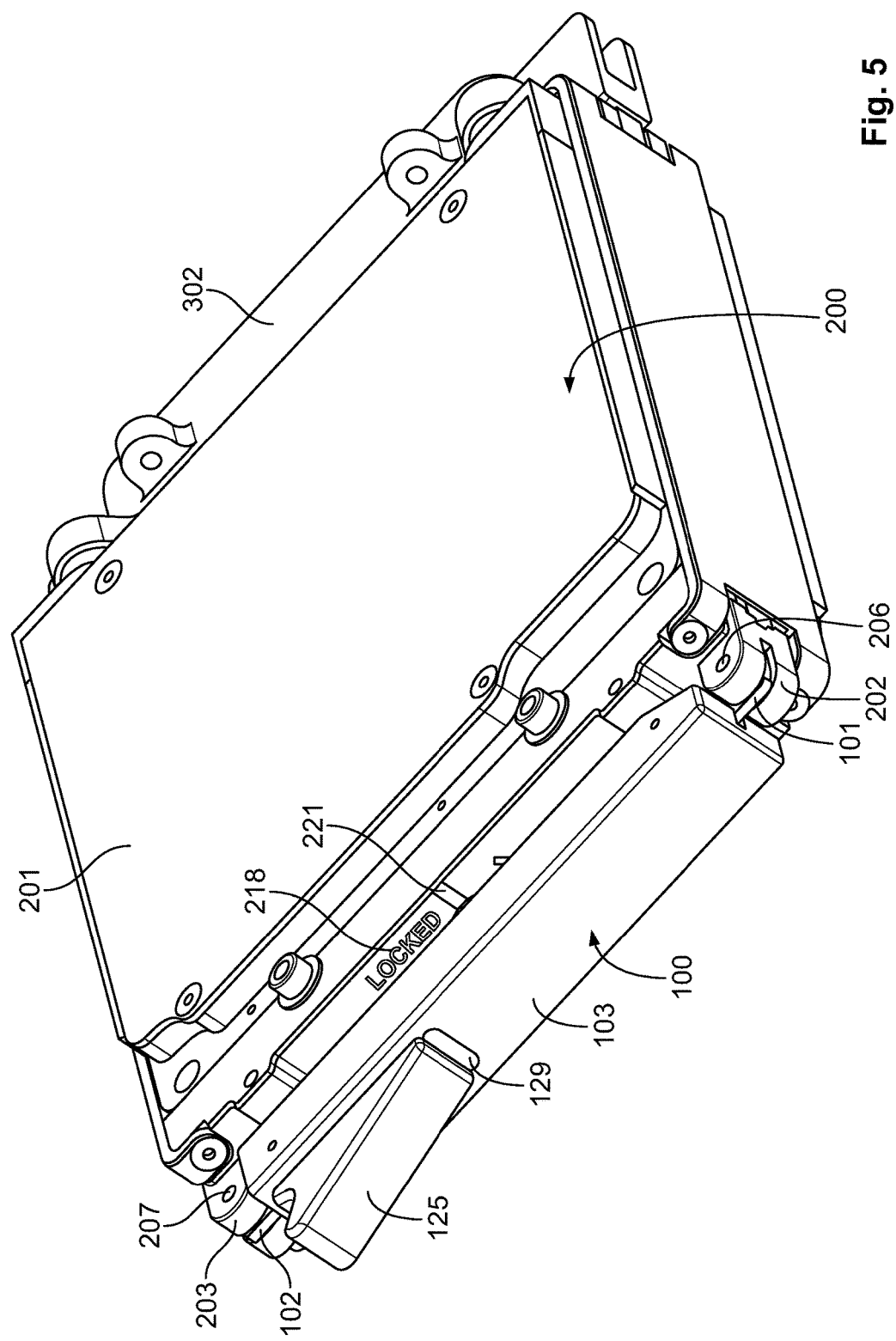
FIG. 5 is a perspective view of the locking device locked to the rackable piece of electronic equipment.
Figure 6:
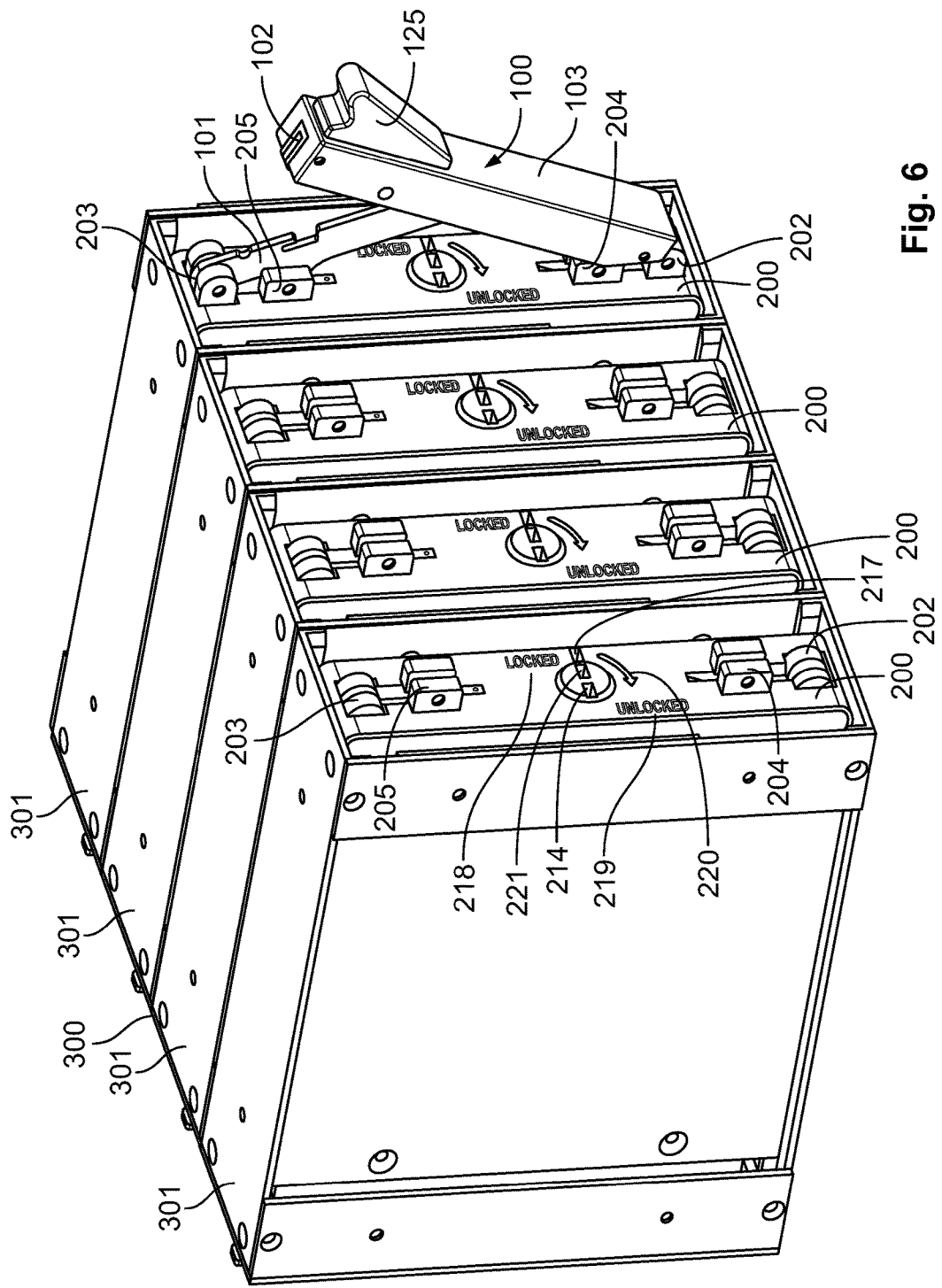
FIG. 6 is a perspective view of the locking device and a plurality of rackable pieces of electronic equipment in a multiple rack.

A lever movement folding the locking device 100 in the direction of the board 200 locks the board 200 to the backplane 302 using the locking strips 210, 211. By lever effect of the hooks 115, 119 about the fixed lock rods 208, 209, the mounting members 114, 118 move the locking strips 210, 211 to make the board 200 advance to its locking position in the backplane 302, as shown in FIGS. 4-6. When the locking device 100 is actuated and mounted in its locking position, the second beam 102 is pivoted flat in the sliding groove 108, as shown in the sectional view of FIG. 4, so that the third hook 120 hooks the spindle 123, the notch 121 surrounds the rod 106, and the free end 117 of the second beam 102 projects from the second end 122 of the handle 103 in similar manner to the first end 113 of the first beam 101 relative to the first end 116 of the handle 103. The spring 111 is stretched and causes the mounting members 118, 119 to respectively apply a pressure on the movable lock rods 206, 207.

The electronic board 200, as shown in FIG. 3, also has a self-locking or secondary locking system ensuring the maintenance of the locking of the board 200 in the rack 300 and permitting unmounting of the locking device 100 for reuse with other rackable pieces of electronic equipment. The board 200 has a locking actuator 214 cooperating with two locking beams 215, 216 which, as soon as the movable locks 202, 203 advance under the action of the locking device 100, are stopped in respective stops 212, 213 of the movable locks 202, 203 to prevent unlocking motion of the locking strips 220, 211. The stops 212, 213 can be seen transparently by way of example in FIG. 3, the first stop 212 being shown moreover in more detail in FIG. 4. In this manner, once the locking strips 210, 211 of the movable locks 202, 203 are in the locking position in the backplane 302 of the rack 300, the locking beams 215, 216 prevent movement of the locking strips 201, 211 and ensure the maintenance of the locked position in the backplane 302, allowing the locking device 100 to be unmounted without risk of disconnection.

The unmounting of the locking device 100 is performed by actuation of an indent 126 of the locking finger 125, sliding the locking finger 125, which releases the locking post 123 from the third hook 120, causing the second beam 102 to slide or pivot in the groove 108 and about the second movable lock rod 107 so as to disengage the mounting members 118, 119 from the movable lock rods 207, 209. The locking finger 125 has a lug 127 which, on the actuation of the finger 125, compresses a lug spring 128, shown in FIG. 4, linked to the second beam 102. Once the mounting members 118, 119 are disengaged, the locking device 100 can be simply unmounted and removed from the board 200. The locking device 100 can be reused to lock or unlock other rackable pieces of electronic equipment, while leaving the board 200 locked in the rack 300 by means of the locking beams 215, 216.

FIG. 5 shows the electronic board 200 locked to the rack backplane 302, with the case 301 of the rack 300 concealed, and with the locking device 100 mounted in the locked position. The locking position or state can be indicated in a plurality of manners, in particular by visual indicators such as texts, colored strips, combinations of these or other similar means. For example, FIGS. 2-5 show visual indicators 129, 130 of the locking state on the handle 103 of the locking device 100. In particular, these indicators 129, 130 can be placed on the handle 103, at the ends of the locking finger 125, so that in the locked state, when the locking finger 125 is in its upper position as shown, a locked indicator 129 corresponding to the locked state can be visible below the locking finger 125. Conversely, if the locking finger 125 is actuated, as shown in FIG. 4, an unlocked indicator 130 is visible in the lower position of the finger 125, therefore corresponding to an unlocked state allowing the locking device 100 to be unmounted.

Similarly, a rackable piece of electronic equipment compatible with the locking device 100 can itself also have an indicator of a locking state. As shown in FIGS. 2, 3, 5 and 6, the case 201 of the electronic board 200 can comprise visual indicators 217, 218, 219 at least one of which can correspond with a visual indicator 221 of the locking actuator 214 in a locked or unlocked state of the board 200. For example, FIG. 2 shows an unlocked state of the board 200, in which the indicator 221 of the locking actuator 214 is turned towards the unlocked indicator 219 of the case 201, while FIG. 6 shows a locked state of each board 200 in the rack 300, with the indicator 221 of the button 214 turned towards the locked state indicators 217, 218 of the case 201.

Each of the mounting members 114, 118 can subsequently act as screwdrivers in order to unscrew the locking actuator 214, in a direction which can be indicated by a visual indicator 220 on the case 201 of the electronic board 200, so as to disengage the locking beams 215, 216 from the stops 212, 213. The board 200 can then be unlocked from the rack 300 by mounting the locking device 100 at the back of this board, as in FIG. 3, and by pulling on the locking device 100 instead of levering towards the board 200.

FIG. 6 shows an example in which the rack 300 is a multiple rack able to accommodate a plurality of electronic boards 200. The locking device 100 according to the present invention can therefore be used in an advantageous manner for locking or unlocking of each electronic board 200 of the multiple rack 300. In particular, a single locking device 100 can be used for all the locking or unlocking operations of all the boards 200 of the multiple rack 300. The locking device 100 can be left, as required, mounted at the back of one of the boards 200 in its locked state, as in FIGS. 4 and 5, or it can be detached to make the assembly more compact and lighter.

What is claimed is:

1. A locking device for a rackable piece of electronic equipment, comprising:
    a first beam extending in a first longitudinal direction and having a U-shaped first mounting member disposed at a first end of the first beam and a first hook disposed adjacent the first end of the first beam; and
    a second beam hinged to the first beam, the first beam and the second beam removably engaging at least one lock of the rackable piece of electronic equipment and locking the rackable piece of electronic equipment to a backplane of a rack, the first mounting member and the first hook each removably engage a separate lock of the rackable piece of electronic equipment; and
    a spring extending in the first longitudinal direction having a first end fixed to the first beam and an opposite second end attached to a first end of the second beam, and a second end of the second beam is movable in translation relative to the first beam.

2. The locking device of claim 1, wherein the second beam extends in a second longitudinal direction, the first end of the second beam pivotably attached to the first beam.

3. The locking device of claim 2, wherein the first end of the second beam is slidable along a sliding groove of the first beam extending in the first longitudinal direction.

4. The locking device of claim 2, wherein the second beam has a U-shaped second mounting member disposed at the second end of the second beam.

5. The locking device of claim 4, wherein the second beam has a second hook disposed adjacent the second end of the second beam.

6. The locking device of claim 5, wherein each of the second mounting member and the second beam engage a lock of the rackable piece of electronic equipment.

7. The locking device of claim 6, wherein the second beam has a third hook forming a cavity in the second beam and spaced apart from the second end of the second beam.

8. The locking device of claim 1, further comprising a handle, the first beam and the second beam at least partially disposed within a beam receiving recess of the handle.

9. The locking device of claim 8, wherein the first beam is fixed in the handle along the first longitudinal direction, the first mounting member projecting beyond an end of the handle.

10. The locking device of claim 8, wherein the handle has a visual indicator of a locking and/or unlocking state of the locking device to the rackable piece of electronic equipment.

11. The locking device of claim 10, wherein the handle has a locking finger movable to release the second beam and permit a removal of the locking device from the rackable piece of electronic equipment.

12. The locking device of claim 11, wherein the visual indicator is visible depending on a position of the locking finger.

13. The locking device of claim 1, wherein the first mounting member unlocks the rackable piece of electronic equipment from the backplane.

14. The locking device of claim 5, wherein the second mounting member and the second hook each removably engage a separate lock of the rackable piece of electronic equipment.

15. A locking device for a rackable piece of electronic equipment, comprising:
    a first beam extending in a first longitudinal direction having a U-shaped first mounting member disposed at a first end and a first hook disposed adjacent to the first end, the first mounting member engaging a first movable lock and the first hook engaging a first fixed lock of the rackable piece of electronic equipment;
    a second beam hinged to the first beam, the first beam removably engaging the first movable lock and the first fixed lock and the second beam removably engaging at least one second lock of the rackable piece of electronic equipment and locking the rackable piece of electronic equipment to a backplane of a rack; and
    a handle having a beam receiving recess, the first beam and the second beam at least partially disposed within the beam receiving recess and the first beam is fixed in the handle along the first longitudinal direction, and the first mounting member projecting beyond an end of the handle.

16. A locking device for a rackable piece of electronic equipment, comprising:
a first beam extending in a first longitudinal direction having a U-shaped first mounting member disposed at a first end and a first hook disposed adjacent to the first end, the first mounting member engaging a first movable lock and the first hook engaging a first fixed lock of the rackable piece of electronic equipment;
a second beam hinged to the first beam, the first beam removably engaging the first movable lock and the first fixed lock and the second beam removably engaging at least one second lock of the rackable piece of electronic equipment and locking the rackable piece of electronic equipment to a backplane of a rack; and
a handle having:
a beam receiving recess, the first beam and the second beam at least partially disposed within the beam receiving recess,
a visual indicator of a locking and/or unlocking state of the locking device to the rackable piece of electronic equipment, and
a locking finger movable to release the second beam and permit a removal of the locking device from the rackable piece of electronic equipment.

17. A locking device for a rackable piece of electronic equipment, comprising:
a first beam extending in a first longitudinal direction having:
a U-shaped first mounting member disposed at a first end and a first hook disposed adjacent to the first end and each of the first mounting member and the first beam engage a lock of the rackable piece of electronic equipment, and
a second beam hinged to the first beam, the first beam and the second beam removably engaging at least one lock of the rackable piece of electronic equipment and locking the rackable piece of electronic equipment to a backplane of a rack; and
a handle having:
a beam receiving recess, the first beam and the second beam at least partially disposed within the beam receiving recess,
a visual indicator of a locking and/or unlocking state of the locking device to the rackable piece of electronic equipment and the visual indicator is visible depending on a position of the locking finger, and
a locking finger movable to release the second beam and permit a removal of the locking device from the rackable piece of electronic equipment.

18. An assembly, comprising:
a rack having a backplane;
a rackable electronic board inserted in the rack has a first movable lock, a second movable lock, a first fixed lock, and a second fixed lock; and
a locking device having:
a first beam and a second beam hinged to the first beam, the first beam and the second beam removably engaging at least one lock of the rackable electronic board and locking the rackable electronic board to the backplane and the first beam engages the first movable lock and the first fixed lock and the second beam engages the second movable lock and the second fixed lock and the first beam has a first mounting member disposed at an end of the first beam and a first hook disposed adjacent the end of the first beam, the first mounting member removably engaging the first movable lock and the first hook removably engaging the first fixed lock.

19. The assembly of claim 18, further comprising a plurality of rackable electronic boards inserted in the rack, one locking device separately locking each of the plurality of rackable electronic boards to the backplane.

20. The assembly of claim 18, wherein the locking device has a spring extending in a first longitudinal direction having a first end fixed to the first beam and an opposite second end attached to a first end of the second beam, and a second end of the second beam is movable in translation relative to the first beam.

21. An assembly, comprising:
a rack having a backplane;
a rackable electronic board inserted in the rack has a first movable lock, a second movable lock, a first fixed lock, and a second fixed lock; and
a locking device having:
a first beam and a second beam hinged to the first beam, the first beam and the second beam removably engaging at least one lock of the rackable electronic board and locking the rackable electronic board to the backplane and the first beam engages the first movable lock and the first fixed lock and the second beam engages the second movable lock and the second fixed lock and the first beam has a first mounting member disposed at an end of the first beam and a first hook disposed adjacent the end of the first beam, the first mounting member removably engaging the first movable lock and the first hook removably engaging the first fixed lock and the second beam has a second mounting member disposed at an end of the second beam and a second hook disposed adjacent the end of the second beam, the second mounting member removably engaging the second movable lock and the second hook removably engaging the second fixed lock.

22. A locking device for a rackable piece of electronic equipment, comprising:
a first beam extending in a first longitudinal direction and having a U-shaped first mounting member disposed at a first end of the first beam and a first hook disposed adjacent the first end of the first beam; and
a second beam hinged to the first beam, the first beam and the second beam removably engaging at least one lock of the rackable piece of electronic equipment and locking the rackable piece of electronic equipment to a backplane of a rack, each of the first mounting member and the first beam engage a lock of the rackable piece of electronic equipment;
a spring extending in the first longitudinal direction having a first end fixed to the first beam and an opposite second end attached to a first end of the second beam, and a second end of the second beam is movable in translation relative to the first beam; and
a handle, the first beam and the second beam at least partially disposed within a beam receiving recess of the handle.

23. The locking device of claim 22, wherein the first beam is fixed in the handle along the first longitudinal direction, the first mounting member projecting beyond an end of the handle.

24. The locking device of claim 22, wherein the handle has a visual indicator of a locking and/or unlocking state of the locking device to the rackable piece of electronic equipment.

25. The locking device of claim 24, wherein the handle has a locking finger movable to release the second beam and permit a removal of the locking device from the rackable piece of electronic equipment.

26. The locking device of claim 25, wherein the visual indicator is visible depending on a position of the locking finger.

27. A locking device for a rackable piece of electronic equipment, comprising:
- a first beam extending in a first longitudinal direction and having a U-shaped first mounting member disposed at a first end of the first beam and a first hook disposed adjacent the first end of the first beam; and
- a second beam hinged to the first beam, the first beam and the second beam removably engaging at least one lock of the rackable piece of electronic equipment and locking the rackable piece of electronic equipment to a backplane of a rack, each of the first mounting member and the first beam engage a lock of the rackable piece of electronic equipment, the second beam extends in a second longitudinal direction, a first end of the second beam pivotably attached to the first beam, the second beam has a U-shaped second mounting member disposed at a second end of the second beam and a second hook disposed adjacent the second end of the second beam, the second mounting member and the second hook each removably engage a separate lock of the rackable piece of electronic equipment; and
- a spring extending in the first longitudinal direction having a first end fixed to the first beam and an opposite second end attached to the first end of the second beam, and the second end of the second beam is movable in translation relative to the first beam.

* * * * *